(12) United States Patent
Yu et al.

(10) Patent No.: US 10,074,631 B2
(45) Date of Patent: Sep. 11, 2018

(54) PACKAGES AND PACKAGING METHODS FOR SEMICONDUCTOR DEVICES, AND PACKAGED SEMICONDUCTOR DEVICES

(71) Applicant: Taiwan Semiconductor Manufacturing Company, Ltd., Hsin-Chu (TW)

(72) Inventors: Chen-Hua Yu, Hsin-Chu (TW);
Shin-Puu Jeng, Hsin-Chu (TW);
Hsien-Wei Chen, Hsin-Chu (TW);
Der-Chyang Yeh, Hsin-Chu (TW);
An-Jhih Su, Bade (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 14/252,625

(22) Filed: Apr. 14, 2014

(65) Prior Publication Data

US 2015/0294939 A1    Oct. 15, 2015

(51) Int. Cl.
| | | |
|---|---|---|
| *H01L 25/065* | (2006.01) | |
| *H01L 25/00* | (2006.01) | |
| *H01L 23/498* | (2006.01) | |
| *H01L 23/538* | (2006.01) | |
| *H01L 23/00* | (2006.01) | |
| *H01L 25/10* | (2006.01) | |
| *H01L 23/31* | (2006.01) | |

(52) U.S. Cl.
CPC .... *H01L 25/0657* (2013.01); *H01L 23/49816* (2013.01); *H01L 23/5381* (2013.01); *H01L 23/5384* (2013.01); *H01L 23/5389* (2013.01); *H01L 24/19* (2013.01); *H01L 25/105* (2013.01); *H01L 25/50* (2013.01); *H01L 23/3128* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/181* (2013.01)

(58) Field of Classification Search
CPC ... H01L 25/0657; H01L 25/105; H01L 24/19; H01L 23/5389; H01L 23/5384; H01L 23/5381; H01L 23/49816
See application file for complete search history.

(56) References Cited

U.S. PATENT DOCUMENTS

| | | | | |
|---|---|---|---|---|
| 7,652,378 | B2 * | 1/2010 | Tseng | ............... H01L 23/53223 257/758 |
| 8,174,091 | B2 * | 5/2012 | Thei | ............... H01L 23/5256 257/529 |

(Continued)

*Primary Examiner* — Jarrett Stark
(74) *Attorney, Agent, or Firm* — Slater Matsil, LLP (57) ABSTRACT

Packages and packaging methods for semiconductor devices, and packaged semiconductor devices are disclosed. In some embodiments, a package for a semiconductor device includes a molding compound and a plurality of through-vias disposed in the molding compound. The package includes an interconnect structure disposed over the plurality of through-vias and the molding compound. The interconnect structure includes a metallization layer. The metallization layer includes a plurality of contact pads and a fuse.

19 Claims, 6 Drawing Sheets

(56) References Cited

U.S. PATENT DOCUMENTS

| | | | |
|---|---|---|---|
| 9,070,687 B2* | 6/2015 | Lai | H01L 23/5256 |
| 9,432,298 B1* | 8/2016 | Smith | H04L 49/9057 |
| 2003/0153173 A1* | 8/2003 | Chuang | H01L 23/5258 |
| | | | 438/613 |
| 2005/0189612 A1* | 9/2005 | Hung | H01L 21/76807 |
| | | | 257/529 |
| 2009/0294899 A1* | 12/2009 | Pagaila | H01L 21/6835 |
| | | | 257/528 |
| 2013/0106459 A1* | 5/2013 | Tseng | H01L 22/14 |
| | | | 324/759.01 |
| 2015/0303158 A1* | 10/2015 | Huang | H01L 24/11 |
| | | | 438/126 |

* cited by examiner

PACKAGES AND PACKAGING METHODS FOR SEMICONDUCTOR DEVICES, AND PACKAGED SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel methods and structures for packaging semiconductor devices. A fuse is formed in a metallization layer of an interconnect structure of a package for a semiconductor device. The fuse may be used to program characterization of integrated circuit dies in the package, or for other purposes.

Figure 1:
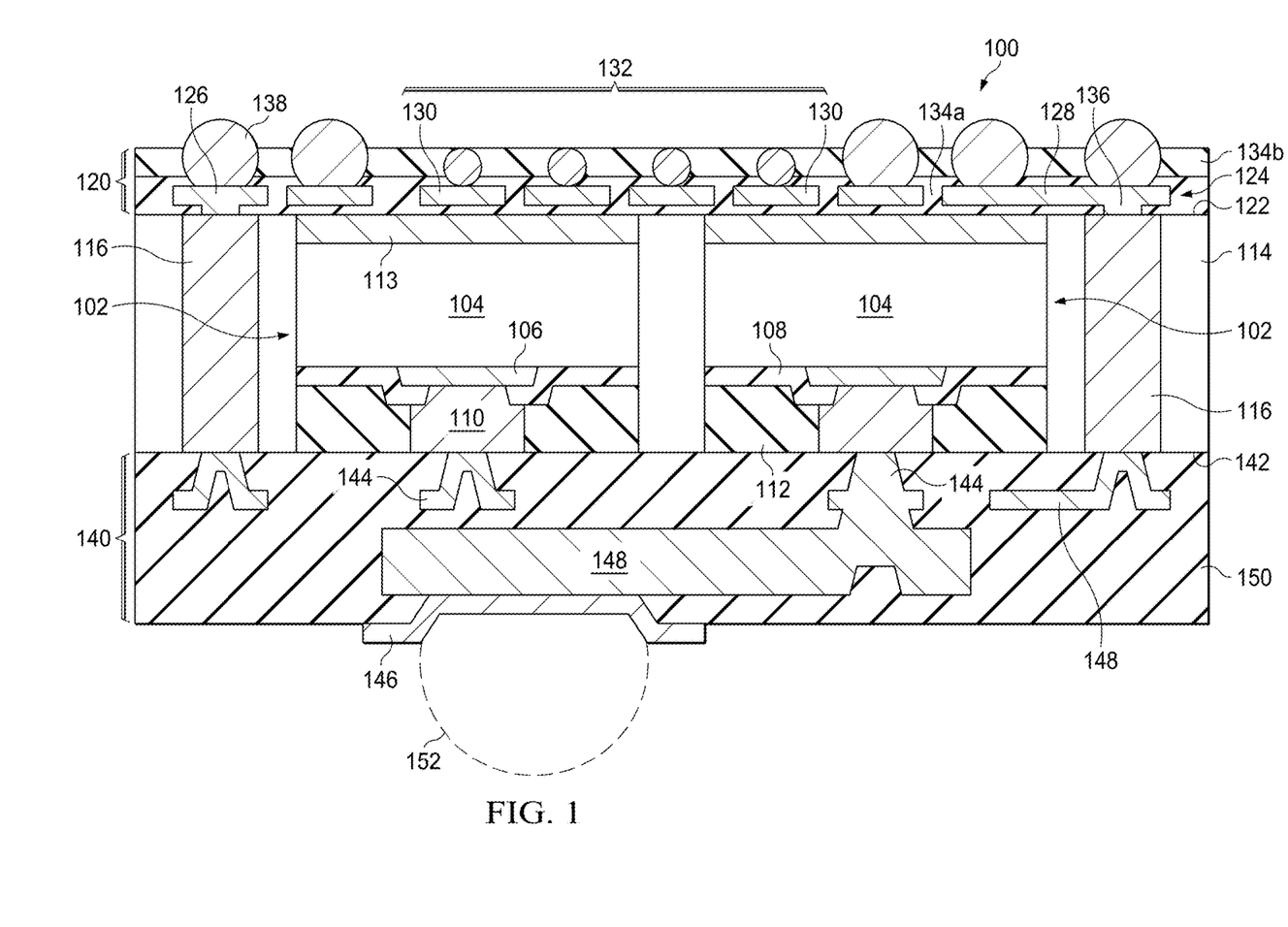
FIG. 1 is a cross-sectional view illustrating a packaged semiconductor device in accordance with some embodiments of the present disclosure.

FIG. 1 is a cross-sectional view illustrating a packaged semiconductor device 100 in accordance with some embodiments of the present disclosure. The packaged semiconductor device 100 includes one or more integrated circuit dies 102. In some embodiments, the packaged semiconductor device 100 comprises a plurality of integrated circuit dies 102. Two integrated circuit dies 102 are shown in the drawings; however, alternatively, a packaged semiconductor device 100 may include one integrated circuit die 102, or three or more integrated circuit dies 102, not shown, in accordance with some embodiments.

The integrated circuit dies 102 each include a workpiece 104. The workpiece 104 may include a semiconductor substrate comprising silicon or other semiconductor materials and may be covered by an insulating layer, for example. The workpiece 104 may also include active and passive components, elements, or circuits, not shown. The workpiece 104 may comprise silicon oxide over single-crystal silicon, for example. The workpiece 104 may conductive layers or semiconductor elements, such as transistors, diodes, capacitors, resistors, inductors, etc. Compound semiconductors, GaAs, InP, Si/Ge, or SiC, as examples, may be used in place of silicon. The workpiece 104 may comprise a silicon-on-insulator (SOI) or a germanium-on-insulator (GOI) substrate, as examples. Alternatively, the workpiece 104 may comprise other types of materials, material layers, and components formed thereon. Each of the integrated circuit dies 102 may include a workpiece 104 that contains predetermined functional circuitry formed thereon. The workpieces 104 of the integrated circuit dies 102 may be adapted to perform the same, similar, or different functions.

The integrated circuit dies 102 may include bond pads 106 formed on a surface of the workpiece 104; e.g., on the bottom surface of the workpiece 104 in the view shown in FIG. 1. The bond pads 106 may comprise Al, Cu, other metals, or alloys thereof, as examples. The surfaces of the workpieces 104 of the integrated circuit dies 102 may include an insulating material 108 comprising a passivation layer such as silicon nitride, silicon oxide, polybenzoxazole (PBO), or other insulators disposed thereon. Openings are formed in the insulating material 108 below the bond pads 106 so that electrical connection can be made to vias 110 which may comprise Cu or other metals. An insulating material 112 which may comprise PBO or other insulators is formed adjacent the insulating material 108 around the vias 110. A die attach film (DAF) 113 may be formed on opposite surfaces of the workpieces 104 of the integrated circuit dies 102; e.g., on the top surface of the workpieces 104 in the view shown in FIG. 1. In some embodiments, the DAF 113 is not included.

A molding compound 114 is disposed around the integrated circuit dies 102. To package the integrated circuit dies 102, in some embodiments, a plurality of the integrated circuit dies 102 are manufactured on a wafer or strip, and the integrated circuit dies 102 are singulated along scribe lines using a die saw, laser, or other device. The DAF 113 of the integrated circuit dies 102 is used to attached the integrated circuit dies 102 to a carrier (not shown), in an inverted view from the view shown in FIG. 1, for example. The molding compound 114 is disposed around the integrated circuit dies 106 over the carrier. The molding compound 114 is formed using a laminating process or other process, in some embodiments. The molding compound 114 fills spaces between the integrated circuit dies 102 and encapsulates the dies 102, for example. The molding compound 114 comprises a molding material and may comprise epoxy, an organic polymer, or a polymer with a silica-based or glass filler added, as examples. In some embodiments, the molding compound 114 comprises a liquid molding compound (LMC) that is a gel type liquid when applied. Alternatively, the molding compound 114 may comprise other insulating materials and may be applied using other methods. The molding compound 114 is then cured using a heating process, infrared (IR) energy exposure process, an ultraviolet (UV) light exposure process, or other methods, as examples.

A plurality of through-vias 116 are formed in the molding compound 114. The through-vias 116 may be formed using an etch process or laser drilling process after the molding compound 114 is applied to form apertures in the molding compound 114, and a conductive material may be filled into the apertures using a deposition or plating process to form the through-vias 116, for example. In other embodiments, before the integrated circuits dies 102 are attached to the carrier, the through-vias 116 may be plated onto the carrier by forming a seed layer over the carrier, forming a photoresist over the seed layer, patterning the photoresist using a lithography process, and plating a conductive material such as Cu, a Cu alloy, or other metals over the seed layer through the patterned photoresist to form the through-vias 116. The photoresist is then removed. The integrated circuit dies 102 are attached to the carrier, and the molding compound 114 is formed around the integrated circuit dies 102 and the through-vias 116. Alternatively, the through-vias 116 may be formed using other methods.

In accordance with some embodiments, a first interconnect structure 120 is disposed over a first side 122 of the plurality of through-vias 116, the molding compound 114, and the integrated circuit dies 102, and a second interconnect structure 140 is disposed over a second side 142 of the plurality of through-vias 116, the molding compound 114, and the integrated circuit dies 102, the second side 142 being opposite the first side 122. The first side 122 comprises a back side of the packaged semiconductor device 100, and the second side 142 comprises a front side of the packaged semiconductor device 100 in some embodiments, for example.

In some embodiments, the second interconnect structure 140 is formed before the first interconnect structure 120 is formed. For example, the integrated circuit dies 102 may be left attached to the carrier after the molding compound 114 and through-vias 116 are formed, and the second interconnect structure 140 may be formed with the carrier still attached. The carrier is then removed, and the first interconnect structure 120 is formed. Alternatively, the carrier can be removed, and the first interconnect structure 120 can be formed, followed by the formation of the second interconnect structure 140.

In some embodiments, after the first interconnect structure 120 and the second interconnect structure 140 are formed, the first interconnect structure 120, the second interconnect structure 140, and the molding compound 114 are then singulated using a die saw, laser, or other device to form a plurality of packaged semiconductor devices 100, with each of the plurality of packaged semiconductor devices 100 including one of the plurality of integrated circuit dies 102 (not shown). In other embodiments, each of the plurality of packaged semiconductor devices 100 includes two or more of the plurality of integrated circuit dies 102 after the singulation process, as shown in FIG. 1. The integrated circuit dies 102 packaged together in the packaged semiconductor device 100 may comprise similar, the same, or different functions, for example. The molding compound 114 is disposed around the integrated circuit dies 102, between adjacent integrated circuit dies 102, between and around the through-vias 116, and between the through-vias 116 and the integrated circuit dies 102.

The first interconnect structure 120 includes a metallization layer 124. The metallization layer 124 includes a plurality of conductive lines 128, a plurality of contact pads 126, and a plurality of fuses 130 formed therein in accordance with some embodiments. The fuses 130 are formed in a fuse region 132. The fuse region 132 may include a single fuse 130 (not shown), or the fuse region 132 may include two or more fuses 130, in some embodiments. The plurality of conductive lines 128, plurality of contact pads 126, and plurality of fuses 130 are formed in the same metallization layer 124 in some embodiments, for example, and may be patterned using the same subtractive etch process, damascene process, other methods, or combinations thereof. The plurality of conductive lines 128, plurality of contact pads 126, and plurality of fuses 130 comprise the same material and comprise substantially the same thickness in some embodiments, for example.

Vias 136 couple some of the contact pads 126 and/or conductive lines 128 to the through-vias 116 in some embodiments. The metallization layer 124 and vias 136 are formed in an insulating material 134a which may comprise a single insulating material layer or a plurality of insulating material layers. An insulating material 134b is disposed over insulating material 134a. The insulating material 134b comprises a back side coating film in some embodiments, for example. The insulating material 134b may include openings over some or all of the contact pads 126 for forming conductors 138, and openings over the fuses 130 to allow access for programming in some embodiments. In other embodiments, the insulating material 134b may not include openings.

The insulating materials 134a and 134b may comprise PBO or other insulators, and the conductive lines 128, vias 136, contact pads 126, and fuses 130 may comprise Cu, Al, other metals, or alloys, combinations, or multiple layers thereof, in some embodiments, as examples. The insulating material layers 134a and 134b, conductive lines 128, vias 136, contact pads 126, and fuses 130 of the first interconnect structure 120 may be formed using subtractive etch techniques, by single or dual damascene techniques, other methods, or combinations thereof, for example. The interconnect structure 120 is disposed over the integrated circuit dies 102, the molding compound 114, and the through-vias 116, for example.

The interconnect structure 120 may include a plurality of metallization layers including conductive lines and/or vias formed therein. The fuses 130 are formed in an uppermost metallization layer 124 of the interconnect structure 120 in embodiments wherein the interconnect structure 120 includes a plurality of metallization layers, for example.

In some embodiments, the conductive lines 128, contact pads 126, and fuses 130 are formed simultaneously within the same metallization layer 124. Advantageously, an additional material layer and lithography processing steps are not required to include the fuses 130 in the packaged semiconductor device 100. The insulating material 134b may be simultaneously patterned using lithography or opened using a laser in some embodiments, to expose the contact pads 126 and the fuses 130, for example. The contact pads 126 are opened before conductors 138 are coupled to the contact pads 126 in some embodiments, for example. In other embodiments, the conductors 138 are not formed or included in the structure. In some embodiments, the insulating material 132b may be formed after the conductors 138 are coupled to the contact pads 126, as another example.

The conductors 138 may comprise a eutectic material such as solder that is coupled to contact pads 126 or bond pads of the interconnect structure 120, for example. The conductors 138 may each comprise a solder bump or a solder ball, as examples. The conductors 138 may function as electrical connectors for the packaged semiconductor device 100. The eutectic material of the conductors 138 may be reflowed to electrically and mechanically connect the packaged semiconductor device 100 to another device or object, for example. In some embodiments, the conductors 138 coupled to the contact pads 126 of the first interconnect structure 120 may comprise controlled collapse chip connection (C4) bumps, as another example. The conductors 138 may alternatively comprise other types of connectors.

Figure 2:
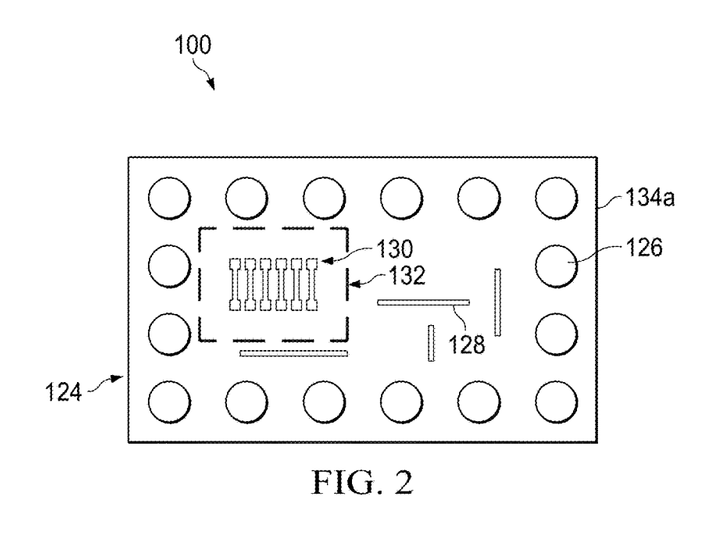
FIGS. 2 through 5 are top views of packaged semiconductor devices in accordance with some embodiments.

The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductors 132 such as solder balls may be formed from SnCu compounds as well, without the use of silver (Ag). Alternatively, lead-free solder connectors may include tin and silver, Sn—Ag, without the use of copper. The conductors 138 are arranged in a single row or in a plurality of rows proximate a perimeter of the packaged semiconductor device 100 in some embodiments, as shown in FIG. 2. The conductors 138 may alternatively be arranged in other shapes. The conductors 138 may also comprise non-spherical conductive connectors, for example.

Referring again to FIG. 1, the second interconnect structure 140 comprises conductive vias 144, contact pads 146, and conductive lines 148 formed within and/or over an insulating material 150, which may comprise a plurality of insulating material layers in some embodiments. The conductive vias 144, contact pads 146, and conductive lines 148 may comprise similar materials described for conductive lines 128, vias 136, and contact pads 126; and insulating material 150 may comprise similar materials described for insulating materials 134a and/or 134b of the first interconnect structure, for example. The contact pads 146 may comprise ball grid array (BGA) ball mounts in some embodiments, for example. In some embodiments, portions of the second interconnect structure 140, such as the contact pads 146, may comprise an under-ball metallization (UBM) structure, as another example.

In some embodiments, conductors 152 may be attached or coupled to the contact pads 146, as shown in phantom (e.g., in dashed lines) in FIG. 1. The conductors 152 may comprise similar materials described for conductors 138, for example. The conductor 152 shown in FIG. 1 may be one among an array of the conductors 152 formed as a grid, referred to as a "ball grid array" or "BGA", in some embodiments. The conductor 152 may comprise a solder ball, and may be larger than conductors 138, in some embodiments.

In some embodiments, the first interconnect structure 120 and/or the second interconnect structure 140 may comprise a redistribution layer (RDL) or a post-passivation interconnect (PPI) structure, for example. In some embodiments, the first interconnect structure 120 and/or the second interconnect structure 140 comprises horizontal electrical connections for the packaged semiconductor device 100, for example. The first interconnect structure 120 and/or the second interconnect structure 140 may comprise fan-out electrical connections in some embodiments. In embodiments wherein two or more of the integrated circuit dies 102 are packaged together, the first interconnect structure 120 and/or the second interconnect structure 140 may comprise horizontal electrical connections between the integrated circuit dies 102, for example. Alternatively, the first interconnect structure 120 and/or the second interconnect structure 140 may comprise other types of electrical connection structures. The plurality of through-vias 116 comprises vertical connections for the packaged semiconductor device 100 in some embodiments.

The novel fuses 130 comprise a metal (e.g., the metal of the metallization layer 124) and may be programmed for device characterization. The metal fuses 130 are more reliable, produce fewer particle defects, and require less area penalty than polysilicon fuses, for example. The fuses 130 are disposed on the back side of the packaged semiconductor device 100 and are thus easily accessible for programming.

In some embodiments, a package for a semiconductor device includes the molding compound 114, the plurality of the through-vias 116 disposed in the molding compound 114, and the first interconnect structure 120 disposed over the plurality of the through-vias 116 and the molding compound 114. The first interconnect structure 120 comprises the metallization layer 124 comprising the plurality of the contact pads 126 and at least one fuse 130 disposed therein. The package may also include the second interconnect structure 140.

FIGS. 2 through 5 are top views illustrating packaged semiconductor devices 100 in accordance with some embodiments of the present disclosure. A back side (e.g., the first side 122 shown in FIG. 1) of a packaged semiconductor device 100 is shown in FIG. 2, without conductors 138 attached to the contact pads 126 of the first interconnect structure 120. Portions of the metallization layer 124 are shown: the contact pads 126, some of the plurality of conductive lines 128, and the fuses 130 in the fuse region 132 are visible through the insulating material 134b. Only a few contact pads 126 are shown in the drawings; however, dozens or hundreds of contact pads 126 may be disposed on the back side of the packaged semiconductor device 100 in accordance with some embodiments. The fuses 130 are disposed proximate an exposed surface of an RDL or PPI of the metallization layer 124 of the first interconnect structure 120 in some embodiments.

In some embodiments, the fuses 130 are grouped together on one or more locations of the first interconnect structure 120. The fuses 130 are grouped together in a single fuse region 132 in the embodiments shown. Alternatively, the fuses 130 may be spread out at various locations across the first interconnect structure 120, not shown.

Figure 3:
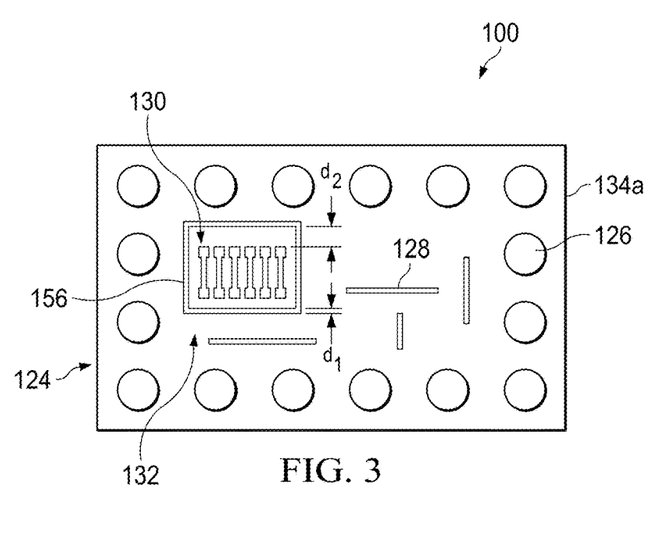

FIG. 3 is a top view of a back side of a packaged semiconductor device 100 in accordance with some embodiments. The metallization layer 124 includes a ring 156 disposed around the plurality of fuses 130 in the fuse region 132. The ring 156 comprises a seal ring in some embodiments. The ring 156 advantageously protects the insulating material 134a and also insulating material 134b (see FIG. 1) from delaminating during programming of the fuses 130. The ring 156 comprises a width comprising dimension $d_1$, wherein dimension $d_1$ comprises about 5 μm or greater in some embodiments. The ring 156 is spaced apart from each of the plurality of fuses 130 by an amount comprising dimension $d_2$, wherein dimension $d_2$ comprises about 20 μm or greater in some embodiments. Alternatively, the ring 156 may comprise other dimensions. The ring 156 may be formed simultaneously with the formation of the contact pads 126, the conductive lines 128, and the fuses 130 formed in the metallization layer 124, for example.

Figure 4:
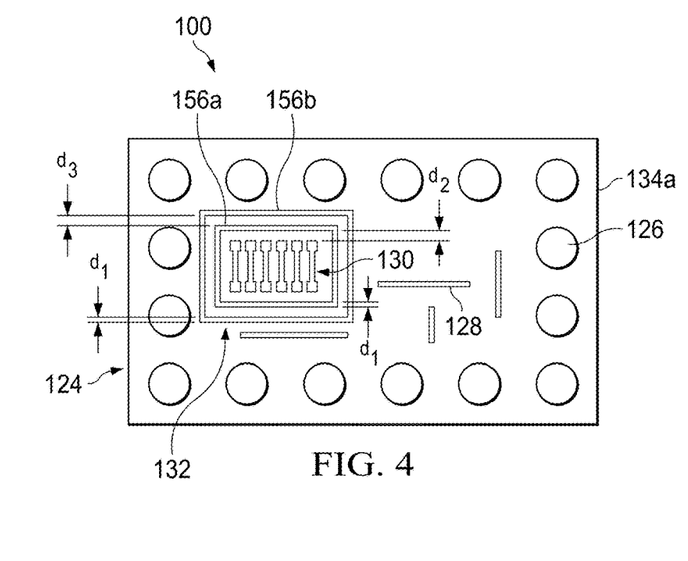

FIG. 4 is a top view of a back side of a packaged semiconductor device 100 in accordance with some embodiments. The metallization layer 124 comprises a first ring 156a disposed around the plurality of fuses 130 in the fuse region 132. The metallization layer further comprises a second ring 156b disposed around the first ring 156a. The second ring 156b provides additional protection for the insulating materials 134a and 134b during programming of the fuses 130. The first and second rings 156a and 156b comprise a double seal ring in some embodiments. The first ring 156a and the second ring 156b comprise a width comprising the dimension $d_1$. The second ring 156b is spaced apart from the first ring 156a by an amount comprising dimension $d_3$, wherein dimension $d_3$ comprises about 10 μm or greater in some embodiments. Alternatively, the first ring 156a and second ring 156b may comprise other dimensions and other relative dimensions. The rings 156a and 156b may advantageously be formed simultaneously with the formation of the contact pads 126, the conductive lines 128, and the fuses 130 formed in the metallization layer 124, for example.

Figure 5:
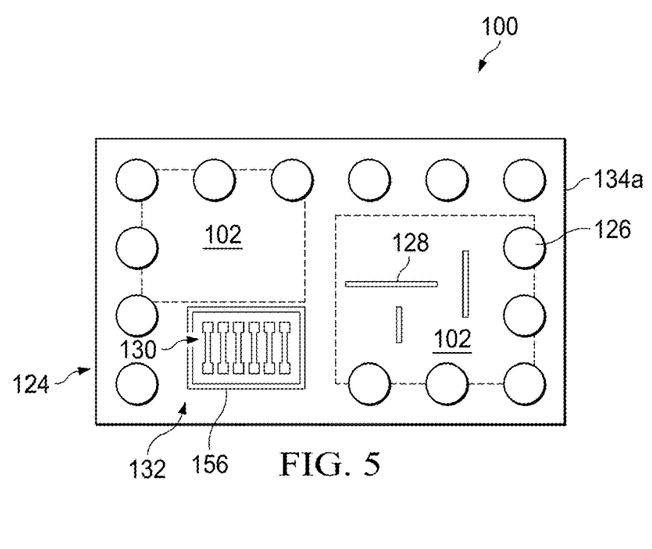

FIG. 5 is a top view of a back side of a packaged semiconductor device 100 in accordance with some embodiments. The fuses 130 in the fuse region 132 are advantageously not disposed over an integrated circuit die 102 in the embodiments shown in FIG. 5, to avoid thermal damage to the integrated circuit dies 102 during the programming of the fuses 130 and to preserve device signal integrity. The positioning of the fuses 130 in the metallization layer 124 of the first interconnect structure 120 can be designed to exclude the integrated circuit die 102 area for the fuse 130 formation, in order to avoid thermal damage during laser ablation used to program the fuses 130, for example. One or more contact pads 126 may be relocated, or unused contact pad 126 locations can be used for positioning of the novel fuses 130 described herein, in accordance with some embodiments, as examples.

Figure 6:
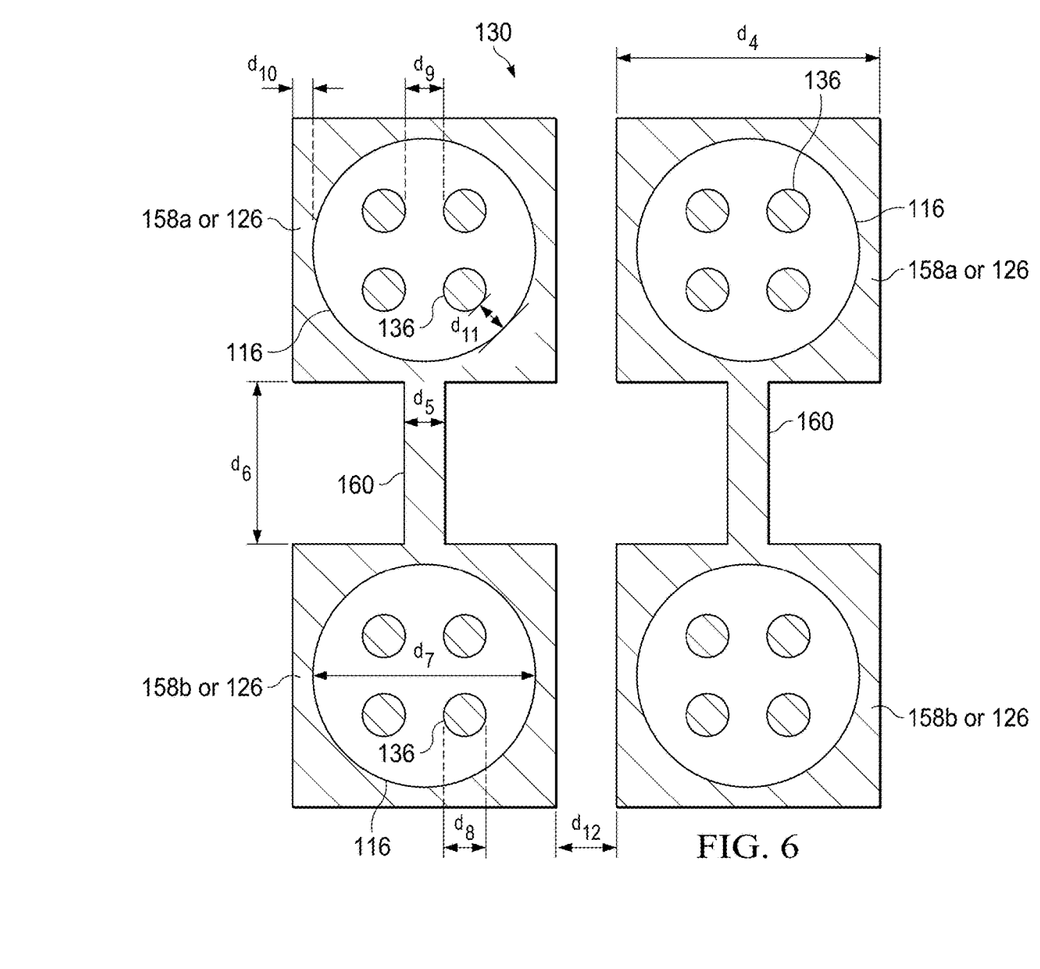
FIG. 6 is a top view of fuses of a packaged semiconductor device in accordance with some embodiments.

FIG. 6 is a top view of two fuses 130 of a packaged semiconductor device 100 in accordance with some embodiments. Some examples of dimensions and relative dimensions of two adjacent fuses 130 are shown. Each of the fuses 130 comprises a first terminal 158a, a fuse element 160 coupled to the first terminal 158a, and a second terminal 158b coupled to the fuse element 160. The fuse element 160 comprises a sacrificial component comprising a thin conductive line or wire that is adapted to be broken or "blown" when a predetermined amount of laser power is applied to the fuse element 160. The width of the fuse element 160 is less than the width of the terminals 158a and 158b in a top view in some embodiments, for example.

The terminals 158a and 158b comprise a width comprising dimension $d_4$, wherein dimension $d_4$ comprises about 140 μm to about 250 μm or greater in some embodiments. The fuse element 160 comprises a width comprising dimension $d_5$, wherein dimension $d_5$ comprises about 2 μm to about 10 μm in some embodiments. The fuse element 160 comprises a length comprising dimension $d_6$, wherein dimension $d_6$ comprises about 50 μm to about 200 μm in some embodiments. Alternatively, the terminals 158a and 158b and fuse element 160 of the fuses 130 may comprise other dimensions.

In some embodiments, the terminals 158a and/or 158b may comprise substantially the same size as a contact pad 126. In some embodiments, the terminals 158a and/or 158b of the fuses 130 may comprise contact pads 126.

In some embodiments, the terminals 158a and 158b of the fuses 130 are disposed over and are electrically coupled to one or more through-vias 116 and/or one or more vias 136. In some embodiments, the first terminal 158a and the second terminal 158b are coupled to one of the through-vias 116 by one or more vias 136, for example. In other embodiments, the terminals 158a and 158b of the fuses 130 are not coupled over a via 136, or the terminals 158a and 158b of the fuses 130 are not coupled over a through-via 116, for example, not shown.

The through-vias 116 comprise a width or diameter comprising dimension $d_7$, wherein dimension $d_7$ comprises about 120 μm to about 200 μm in some embodiments. The vias 136 comprise a width or diameter comprising dimension $d_8$, wherein dimension $d_8$ comprises about 10 μm to about 80 μm in some embodiments. Spaces between adjacent vias 136 comprise a width comprising dimension $d_9$, wherein dimension $d_9$ comprises about 10 μm or greater in some embodiments. The terminals 158a and 158b may have a greater width than the through-vias 116 on each side by an amount comprising dimension $d_{10}$, wherein dimension $d_{10}$ comprises about 10 μm or greater in some embodiments. The through-vias 116 have a greater width than the vias 136 on the sides by an amount comprising dimension $d_{11}$, wherein dimension $d_{11}$ comprises about 10 μm or greater in some embodiments. The terminals 158a and 158b of fuses 130 are spaced apart from terminals 158a and 158b of adjacent fuses 130 by an amount comprising dimension $d_{12}$, wherein dimension $d_{12}$ comprises about 10 μm or greater in some embodiments. Alternatively, the fuses 130, through-vias 116, and vias 136 may comprise other dimensions and/or other relative dimensions.

In embodiments wherein the terminals 158a and 158b of the fuses 130 are disposed over and are electrically coupled to one or more vias 136, and the one or more vias 136 are disposed over and are electrically coupled to one or more through-vias 116, the other end of the through-via or vias 116 may be coupled to the second interconnect structure 140 (refer again to FIG. 1). The second interconnect structure 140 may include horizontal wiring that is coupled between the through-via or vias 116 and one or more of the integrated circuit dies 102. Thus, in some embodiments, one or more of the fuses 130 may be coupled to one or more of the integrated circuit dies 102 by one or more of the through-vias 116 and the second interconnect structure 140, in some embodiments.

Figure 7A:
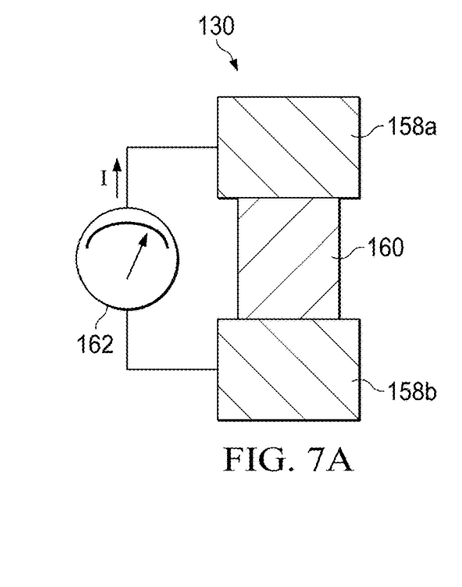
FIGS. 7A and 7B are block diagrams illustrating programming states of a fuse in accordance with some embodiments.
Figure 7B:
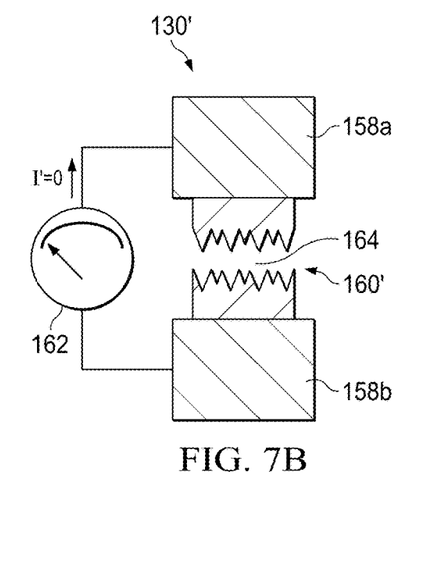

FIGS. 7A and 7B are block diagrams illustrating programming states of a fuse 130 in accordance with some embodiments. FIG. 7A shows a fuse 130 that has not been programmed. The fuse element 160 is intact, and a current I applied using a current source 162 flows through the first terminal 158a, the fuse element 160, and the second terminal 158b. To program the fuse 130, a large enough amount of laser power is applied to the fuse element 160, such as about 0.5 Watts (W) to about 5 W, to cause or form a break 164 in the fuse element 160', as shown in FIG. 7B. The break 164 in the fuse element 160' prevents an applied current I' from flowing; e.g., current I'=0. Thus, the applied current I' is prevented from flowing through the programmed fuse 130'.

In some embodiments, a characterization of one of the integrated circuit dies 102 (see FIG. 1) is programmable using one of the fuses 130 described herein. In some embodiments, the fuses 130 are programmable by blowing the fuses 130 using a laser.

Figure 8:
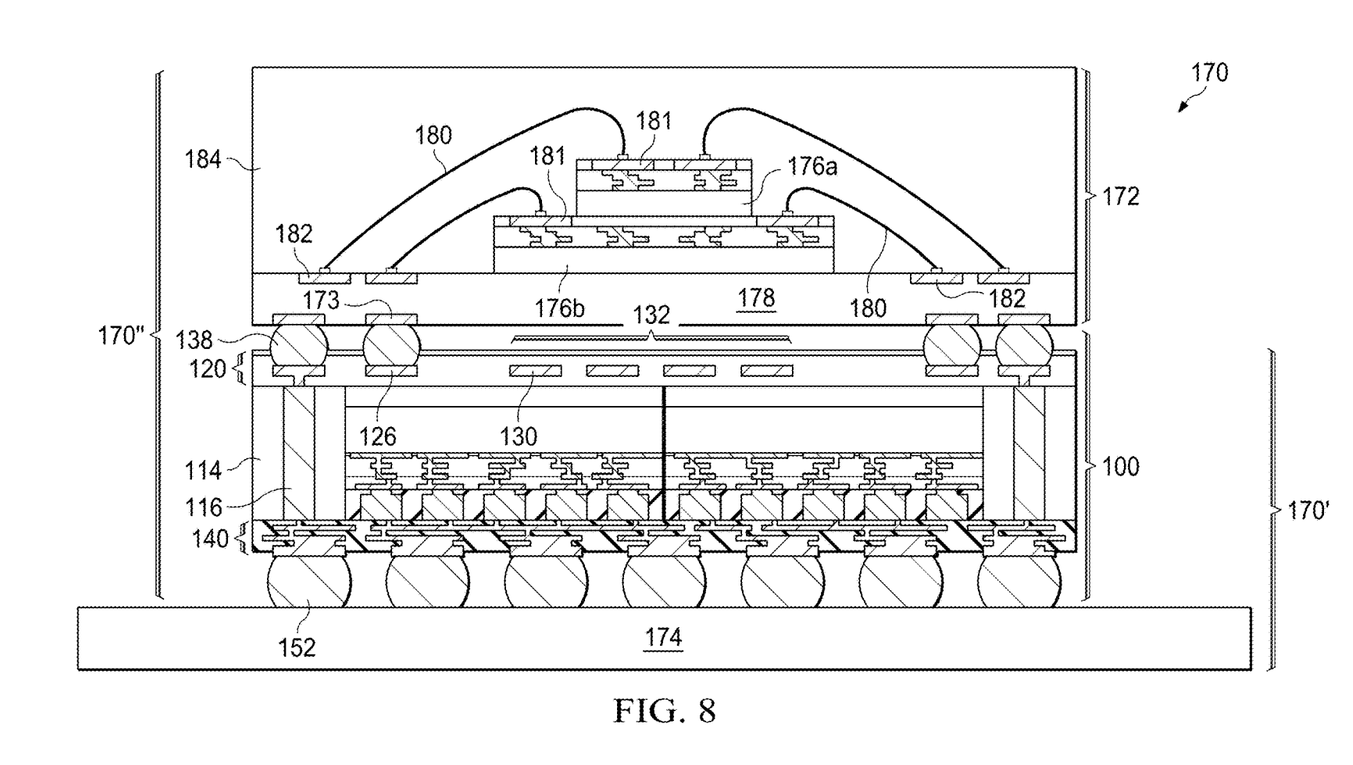
FIG. 8 is a cross-sectional view illustrating a packaged semiconductor device in accordance with some embodiments.

FIG. 8 is a cross-sectional view illustrating a packaged semiconductor device 170 in accordance with some embodiments. The packaged semiconductor device 170 comprises a package-on-a package (PoP) device in accordance with some embodiments. The PoP device 170 includes a packaged semiconductor device 100 described herein that includes at least one of the novel fuses 130 disposed within the first interconnect structure 120. The packaged semiconductor device 100 is coupled to another packaged semiconductor device 172 in some embodiments. The packaged semiconductor device 100 comprises a first packaged semiconductor device, and the packaged semiconductor device 172 comprises a second packaged semiconductor device that is coupled to the packaged semiconductor device 100 in accordance with some embodiments, for example.

The first packaged semiconductor device 100 includes the plurality of through-vias 116 formed within the molding compound 114. The through-vias 116 provide vertical connections for the packaged semiconductor devices 100 and 172. Some of the contact pads 126 of the first packaged semiconductor device 100 are coupled to contact pads 173 of second packaged semiconductor device 172 by conductors 138.

In some embodiments, a plurality of conductors 152 of the first packaged semiconductor device 100 are coupled to a substrate 174. The substrate 174 may comprise a printed circuit board (PCB) in some embodiments. Alternatively, the substrate 174 may comprise other materials, such as an interposer, another integrated circuit die, or other objects, as example.

In some embodiments, a packaged semiconductor device 170' includes the packaged semiconductor device 100 that is coupled to the substrate 174 by the conductors 152. In these embodiments, a second packaged semiconductor device 172 is not coupled to the first packaged semiconductor device 100, for example. The packaged semiconductor device 170' may comprise a wafer level package (WLP) or fan-out WLP (FOWLP) in some embodiments, for example.

In embodiments wherein a second packaged semiconductor device 172 is included, the second packaged semiconductor device 172 includes one or more integrated circuit dies 176a and/or 176b coupled to a substrate 178. One integrated circuit die 176b may be coupled to the substrate 178, and the other integrated circuit die 176a may be coupled to a top surface of the other integrated circuit die 176b in a stack. One end of wire bonds 180 may be coupled to contact pads 181 on a top surface of the integrated circuit die or dies 176a and/or 176b, and the other end of the wire bonds 180 may be coupled to bond pads 182 on the substrate 174. A molding compound 184 may be disposed over the wire bonds 180, integrated circuit die or dies 176a and/or 176b, and the substrate 178.

Alternatively, a PoP device 170 may include two packaged semiconductor devices 100 described herein that are coupled together in some embodiments, not shown in the drawings. In some embodiments, the PoP device 170 may comprise a system-on-a-chip (SOC) device, as another example. In some embodiments, the substrate 174 is not included in the packaged semiconductor device, as shown at 170".

In some embodiments, an underfill material and/or molding compound (not shown) may be disposed between the plurality of conductors 152 and between the substrate 174 and the second interconnect structure 140 of the first packaged semiconductor device 100. Likewise, an underfill material and/or molding compound (also not shown) may be disposed between the plurality of conductors 138 and between the first packaged semiconductor device 100 and the second packaged semiconductor device 172.

Figure 9:
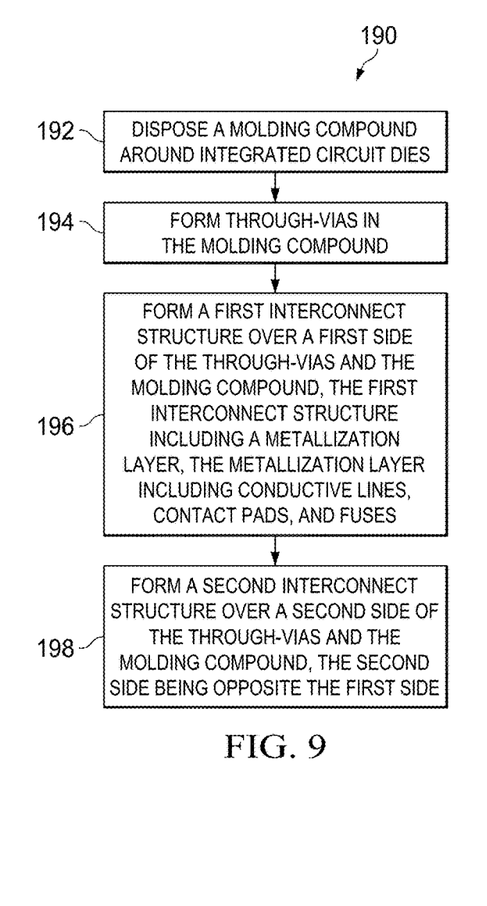
FIG. 9 is a flow chart of a method of packaging a semiconductor device in accordance with some embodiments.

FIG. 9 is a flow chart 190 of a method of packaging a semiconductor device in accordance with some embodiments. In step 192, a molding compound 114 is disposed around integrated circuit dies 102 (see also FIG. 1). In step 194, through-vias 116 are formed in the molding compound 114. In step 196, a first interconnect structure 120 is formed over a first side 122 of the through-vias 116 and the molding compound 114, the first interconnect structure 120 including a metallization layer 124. The metallization layer 124 includes conductive lines 128, contact pads 126, and fuses 130. In step 198, a second interconnect structure 140 is formed over a second side 142 of the through-vias 116 and the molding compound 114, the second side 142 being opposite the first side 122.

Some embodiments of the present disclosure include packages for semiconductor devices. Other embodiments include methods of packaging semiconductor devices, and packaged semiconductor devices that have been packaged using the novel methods.

Some embodiments of the present disclosure also include methods of programming packaged semiconductor devices 100, 170, 170', and/or 170". For example, an integrated circuit die or dies 102 are packaged using the novel methods described herein that include the fuses 130 disposed proximate a surface of the first interconnect structure 120. One or more of the fuses 130 are programmed or are programmable by blowing the fuses 130 using a laser.

Embodiments of the present disclosure provide novel methodologies for fuse structures in packages for semiconductor devices. The fuses are formed in a metallization layer of an interconnect structure that is proximate a surface of the package, so that the fuses are accessible and may be programmed using a laser (e.g., using a laser pulse). The fuses may advantageously be formed in the same metallization layer that conductive lines and contact pads are formed in, so that an additional material layer and lithography process is not required, and providing a low-cost method of forming the fuses. The protective rings disposed around the fuses in some embodiments may also be formed within the same metallization layer. The fuses may be programmed during the same laser process used to open an insulating material over contact pads, so that an additional laser process is not required.

The fuses comprise a metal and are thus more reliable, produce fewer particle defects, and require less area penalty than polysilicon fuses. The fuses may be programmed for device characterization, signal matching, and for other purposes. The fuses are disposed on a back side of the packaged semiconductor devices and are thus easily accessible for programming, and damage to device performance from programming the fuses is reduced or avoided. Other portions of the metallization layer (e.g., such as PPI lines in embodiments wherein the first interconnect comprises a PPI interconnect) are covered by an insulating material (such as insulating material 134b shown in FIG. 1) during laser programming of the fuses, avoiding particle contamination and/or defects. Furthermore, the fuses and packaging methods described herein are easily implementable in packaging process flows.

In some embodiments, a package for a semiconductor device includes a molding compound and a plurality of through-vias disposed in the molding compound. The package includes an interconnect structure disposed over the plurality of through-vias and the molding compound. The interconnect structure includes a metallization layer. The metallization layer includes a plurality of contact pads and a fuse.

In other embodiments, a packaged semiconductor device includes an integrated circuit die, a molding compound disposed around the integrated circuit die, and a plurality of through-vias disposed in the molding compound. A first interconnect structure is disposed over a first side of the plurality of through-vias and the molding compound. The first interconnect structure includes a metallization layer that includes a plurality of conductive lines, a plurality of contact pads, and a plurality of fuses. A second interconnect structure is disposed over a second side of the plurality of through-vias and the molding compound, the second side being opposite the first side.

In yet other embodiments, a method of packaging a semiconductor device includes disposing a molding compound around a plurality of integrated circuit dies, and forming a plurality of through-vias in the molding compound. A first interconnect structure is formed over a first side of the plurality of through-vias and the molding compound. The first interconnect structure includes a metallization layer. The metallization layer includes a plurality of conductive lines, a plurality of contact pads, and a plurality of fuses. A second interconnect structure is formed over a second side of the plurality of through-vias and the molding compound, the second side being opposite the first side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package for a semiconductor device, comprising:
    an integrated circuit die having formed therein a topmost metallization layer, the topmost metallization layer including bond pads for bonding the integrated circuit die to another device;
    a molding compound encapsulating the integrated circuit die;
    a plurality of through-vias disposed in the molding compound; and
    an interconnect structure disposed over the plurality of through-vias and the molding compound, the interconnect structure comprising a second metallization layer, the second metallization layer comprising a plurality of contact pads and a fuse, the plurality of contact pads and fuse being in a plane that is vertically displaced from a plane of in which the bond pads are formed, wherein the fuse is disposed outside of a footprint of the integrated circuit die in a top down view.

2. The package according to claim 1, wherein the interconnect structure comprises a redistribution layer (RDL) or a post-passivation interconnect (PPI) structure, and wherein the fuse is disposed proximate an exposed surface of the RDL or PPI.

3. The package according to claim 1, wherein the interconnect structure comprises a first interconnect structure, wherein the first interconnect structure is disposed over a first side of the plurality of through-vias and the molding compound, and wherein the package further comprises a second interconnect structure disposed over a second side of the plurality of through-vias and the molding compound, the second side being opposite the first side.

4. The package according to claim 1, wherein the second metallization layer comprises a plurality of fuses.

5. The package according to claim 4, wherein the topmost metallization layer comprises a ring disposed around the plurality of fuses.

6. The package according to claim 5, wherein the ring comprises a first ring, and wherein the topmost metallization layer further comprises a second ring disposed around the first ring.

7. The package according to claim 5, wherein the ring is spaced apart from the plurality of fuses by about 20 μm or greater, or wherein the ring comprises a width of about 5 μm or greater.

8. A packaged semiconductor device, comprising:
    an integrated circuit die, the integrated circuit die having an outermost periphery;
    a molding compound encapsulating and disposed around the integrated circuit die;
    a plurality of through-vias disposed in the molding compound; and
    a first interconnect structure disposed over a first side of the plurality of through-vias and the molding compound, the first interconnect structure comprising a metallization layer, the metallization layer comprising a plurality of conductive lines, a plurality of contact pads, and a plurality of fuses, wherein the plurality of fuses are located outside a projection of the outermost periphery of the integrated circuit die in a top down view.

9. The packaged semiconductor device according to claim 8, further comprising a plurality of integrated circuit dies disposed within the molding compound.

10. The packaged semiconductor device according to claim 8 further comprising a second interconnect structure, wherein the first interconnect structure or the second interconnect structure comprises horizontal electrical connections for the packaged semiconductor device, and wherein the plurality of through-vias comprise vertical electrical connections for the packaged semiconductor device.

11. The packaged semiconductor device according to claim 8, wherein each of the plurality of fuses comprises a first terminal, a fuse element coupled to the first terminal, and a second terminal coupled to the fuse element.

12. The packaged semiconductor device according to claim 11, wherein the fuse element comprises a width of about 2 µm to about 10 µm or a length of about 50 µm to about 200 µm in a top view.

13. The packaged semiconductor device according to claim 11, wherein the first terminal or the second terminal is coupled to one of the plurality of through-vias.

14. The packaged semiconductor device according to claim 13, wherein the first terminal or the second terminal is coupled to the one of the plurality of through-vias by a via disposed between the one of the plurality of through-vias and the first terminal or the second terminal.

15. A packaged semiconductor device, comprising:
   a first packaged semiconductor device, the first packaged semiconductor device comprising:
      a die;
      a molding compound encapsulating the die;
      a through-via disposed in the molding compound and extending from a first side of the molding compound to a second side of the molding compound, the first side being opposite the second side; and
      a first interconnect structure disposed over the first side of the molding compound and the through-via, the first interconnect structure comprising a plurality of conductive lines, a plurality of conductive vias, a plurality of contact pads, and a plurality of metal fuses, the plurality of metal fuses being disposed in a fuse region, wherein at least one metal fuse of the plurality of metal fuses has a terminal that directly overlies and is vertically aligned with the plurality of conductive vias and the plurality of conductive vias directly overlies and is vertically aligned with the through-via, wherein the fuse region is offset from the die in a top down view.

16. The packaged semiconductor device according to claim 15, further comprising:
   a second packaged semiconductor device connected to the first packaged semiconductor device by a first plurality of conductors on a first side of the first packaged semiconductor device, the second packaged semiconductor device comprising a plurality of integrated circuit dies; and
   a substrate connected to the first packaged semiconductor device by a second plurality of conductors on a second side of the first packaged semiconductor device, the second side of the first packaged semiconductor device being opposite the first side.

17. The packaged semiconductor device according to claim 15, further comprising a first sealing ring in the fuse region, the first sealing ring surrounding the plurality of metal fuses.

18. The packaged semiconductor device according to claim 17, wherein the first sealing ring is separated from the plurality of metal fuses by a distance of about 20 µm or greater.

19. The packaged semiconductor device according to claim 18, further comprising a second sealing ring surrounding the plurality of fuses, the second sealing ring being separated from the first sealing ring by a distance of about 10 µm or greater.

* * * * *